`US009653645B2`

United States Patent
Jang et al.

(10) Patent No.: US 9,653,645 B2
(45) Date of Patent: May 16, 2017

(54) LIGHT EMITTING DIODE

(71) Applicant: SEOUL VIOSYS CO., LTD., Ansan-si (KR)

(72) Inventors: Jong Min Jang, Ansan-si (KR); Seon Min Bae, Ansan-si (KR); Chae Hon Kim, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 15/184,924

(22) Filed: Jun. 16, 2016

(65) Prior Publication Data

US 2016/0372630 A1 Dec. 22, 2016

(30) Foreign Application Priority Data

Jun. 16, 2015 (KR) ........................ 10-2015-0085482

(51) Int. Cl.
| | | |
|---|---|---|
| H01L 33/02 | (2010.01) | |
| H01L 33/42 | (2010.01) | |
| H01L 33/40 | (2010.01) | |
| H01L 33/38 | (2010.01) | |
| H01L 33/24 | (2010.01) | |
| H01L 33/16 | (2010.01) | |
| H01L 33/08 | (2010.01) | |
| H01L 33/62 | (2010.01) | |
| H01L 33/44 | (2010.01) | |
| H01L 33/32 | (2010.01) | |
| H01L 33/18 | (2010.01) | |

(52) U.S. Cl.
CPC ............ *H01L 33/025* (2013.01); *H01L 33/08* (2013.01); *H01L 33/16* (2013.01); *H01L 33/18* (2013.01); *H01L 33/24* (2013.01); *H01L 33/32* (2013.01); *H01L 33/38* (2013.01); *H01L 33/382* (2013.01); *H01L 33/405* (2013.01); *H01L 33/42* (2013.01); *H01L 33/44* (2013.01); *H01L 33/62* (2013.01)

(58) Field of Classification Search
None
See application file for complete search history.

(56) References Cited

U.S. PATENT DOCUMENTS

2016/0372630 A1* 12/2016 Jang ..................... H01L 33/025

* cited by examiner

*Primary Examiner* — Jack Chen
(74) *Attorney, Agent, or Firm* — Perkins Coie LLP

(57) ABSTRACT

A light emitting diode includes: a light emitting structure including a first conductive type semiconductor layer, a second conductive type semiconductor layer, and an active layer interposed between the first conductive type semiconductor layer and the second conductive type semiconductor layer; a first contact electrode forming ohmic contact with the first conductive type semiconductor layer; a second contact electrode disposed on the second conductive type semiconductor layer; and an insulation layer disposed on the light emitting structure and insulating the first contact electrode from the second contact electrode, wherein the first conductive type semiconductor layer includes a nitride-based substrate, the nitride-based substrate having a thread dislocation density of $10^4$ cm$^{-2}$ or less, an oxygen impurity concentration of $10^{19}$ cm$^{-3}$ or less, and an optical extinction coefficient of less than 5 cm$^{-1}$ at a wavelength of 465 nm to 700 nm.

26 Claims, 10 Drawing Sheets

LIGHT EMITTING DIODE

CROSS-REFERENCE TO RELATED APPLICATIONS

This patent document claims the benefit of priority of Korean Patent Application No. 10-2015-0085482, filed on Jun. 16, 2015. The entire content of the before-mentioned patent application is incorporated by reference as part of the disclosure of this application.

TECHNICAL FIELD

Exemplary embodiments described in the present document relate to a light emitting diode, and more particularly, to a light emitting diode that has good optical and electrical properties to secure high luminous efficacy.

BACKGROUND

Recently, with increasing demand for small high output light emitting devices, demand for large flip-chip type light emitting diodes applicable to high output light emitting devices has increased. A flip-chip type light emitting diode has an electrode directly bonded to a secondary substrate and does not employ a wire for supply of external power thereto, thereby providing much higher heat dissipation efficiency than a lateral type light emitting diode. Accordingly, even upon application of high current density, the flip-chip type light emitting diode can effectively transfer heat to the secondary substrate and thus can be suitably used as a light source for high output light emitting devices.

SUMMARY

Exemplary embodiments provide a light emitting diode that has a non-polar or semi-polar growth plane so as to provide high internal quantum efficiency and that has improved ohmic contact characteristics between a semiconductor layer and a contact electrode, thereby providing good electrical characteristics.

Exemplary embodiments provide a light emitting diode that is manufactured on a growth substrate having a predetermined density of thread dislocations and a predetermined concentration of oxygen.

In accordance with one aspect, a light emitting diode includes: a light emitting structure including a first conductive type semiconductor layer, a second conductive type semiconductor layer, and an active layer interposed between the first conductive type semiconductor layer and the second conductive type semiconductor layer; a first contact electrode forming ohmic contact with the first conductive type semiconductor layer; a second contact electrode disposed on the second conductive type semiconductor layer; and an insulation layer disposed on the light emitting structure and insulating the first contact electrode from the second contact electrode, wherein the first conductive type semiconductor layer includes a nitride-based substrate, the nitride-based substrate having a thread dislocation density of $10^4$ cm$^{-2}$ or less, an oxygen impurity concentration of $10^{19}$ cm$^{-3}$ or less, and an optical extinction coefficient of less than 5 cm$^{-1}$ at a wavelength of 465 nm to 700 nm.

The nitride-based substrate may have a thread dislocation density of $10^3$ cm$^{-2}$ or less and an oxygen impurity concentration of $3\times10^{17}$ cm$^{-3}$ or less.

The nitride-based substrate may have a non-polar or semi-polar growth plane.

The nitride-based substrate may be doped or undoped to have the same conductive type as the first conductive type semiconductor layer.

The nitride-based substrate may have a thickness of 270 µm to 330 µm.

The second contact electrode may include a conductive oxide layer forming ohmic contact with the second conductive type semiconductor layer and a reflective electrode layer disposed on the conductive oxide layer.

The conductive oxide layer may include indium tin oxide (ITO) and the reflective electrode layer may include silver (Ag).

The conductive oxide layer may have a larger area than the reflective electrode layer and the reflective electrode layer may be placed within a peripheral region of the conductive oxide layer.

The conductive oxide layer may cover 90% or more of an upper surface of the second conductive type semiconductor layer.

The light emitting structure may include a plurality of mesas each including the second conductive type semiconductor layer and the active layer, the second contact electrode may be disposed on the plurality of mesas, and the first conductive type semiconductor layer may be exposed through at least some region around the plurality of mesas.

The insulation layer may include a first insulation layer and a second insulation layer, and the first insulation layer may cover the plurality of mesas and the first conductive type semiconductor layer and may include a first opening and a second opening partially exposing the first conductive type semiconductor layer and the second contact electrode, respectively.

The first contact electrode may form ohmic contact with the first conductive type semiconductor layer through the first opening, and may be disposed on a portion of upper surfaces of the plurality of mesas and on side surfaces of the plurality of mesas while being insulated from the plurality of mesas.

The second insulation layer may partially cover the first contact electrode and may include a third opening and a fourth opening partially exposing the first contact electrode and the second contact electrode, respectively.

The light emitting diode may further include a first pad electrode disposed on the second insulation layer and electrically connected to the first contact electrode through the third opening; and a second pad electrode disposed on the second insulation layer and electrically connected to the second contact electrode through the fourth opening.

The insulation layer may cover the plurality of mesas and the first conductive type semiconductor layer, and may include a first opening and a second opening partially exposing the first conductive type semiconductor layer and the second contact electrode, respectively.

The first contact electrode may form ohmic contact with the first conductive type semiconductor layer through the first opening, and may be disposed on a portion of upper surfaces of the plurality of mesas and on side surfaces of the plurality of mesas while being insulated from the plurality of mesas.

The light emitting diode may further include a pad electrode disposed on the insulation layer and electrically connected to the second contact electrode through the second opening, and the pad electrode may be spaced apart from the first contact electrode.

The light emitting structure may include a first region including one side surface thereof and a second region including the other side surface opposite the one side surface, and the first contact electrode may be disposed within the first region and the pad electrode may be disposed within the second region.

The first contact electrode may be placed on at least part of the exposed region of the first conductive type semiconductor layer.

The insulation layer may cover the plurality of mesas and the first conductive type semiconductor layer, and may include a first opening and a second opening partially exposing the first contact electrode and the second contact electrode, respectively.

The light emitting diode may further include a first pad electrode disposed on the insulation layer and electrically connected to the first contact electrode through the first opening; and a second pad electrode disposed on the insulation layer and electrically connected to the second contact electrode through the second opening, wherein the first pad electrode may be placed on a portion of upper surfaces of the plurality of mesas and on a portion of side surfaces of the plurality of mesas while being separated from the plurality of mesas via the insulation layer.

The light emitting structure may include a region through which the first conductive type semiconductor layer is partially exposed, and the insulation layer may include a first insulation layer. The first insulation layer may partially cover the light emitting structure and the second contact electrode and may include a first opening and a second opening partially exposing the first conductive type semiconductor layer and the second contact electrode, respectively.

The first insulation layer may include a pre-insulation layer and a main insulation layer disposed on the pre-insulation layer, and the pre-insulation layer may cover a portion of the light emitting structure and a portion of a conductive oxide.

The pre-insulation layer may include an opening partially exposing the conductive oxide and the reflective electrode layer may be disposed inside the opening.

The main insulation layer may partially cover the reflective electrode layer.

The insulation layer may further include a second insulation layer disposed on the first insulation layer and partially covering the first contact electrode, and the first insulation layer may have a greater thickness than the second insulation layer.

According to various embodiments, a light emitting diode includes a second contact electrode forming ohmic contact of low contact resistance with a light emitting structure having a non-polar or semi-polar growth plane, particularly, with a second conductive type semiconductor layer having a non-polar or semi-polar growth plane, thereby reducing forward voltage ($V_f$) while improving reliability of the light emitting diode. Furthermore, the light emitting diode according to the exemplary embodiments includes a first conductive type semiconductor layer having a predetermined thickness or more in order to achieve good thermal reliability and uniform lateral current spreading, thereby providing high luminous power.

Furthermore, the light emitting diode according to the exemplary embodiments includes a light emitting structure formed using a growth substrate that is produced by a solvothermal method, particularly, an ammonothermal method and has high quality, thereby securing good crystallinity while reducing light loss.

BRIEF DESCRIPTION OF DRAWINGS

The accompanying drawings, which are included to provide a further understanding of the disclosed technology, and are incorporated in and constitute a part of this specification, illustrate exemplary embodiments of the disclosed technology, and together with the description serve to explain the principles of the disclosed technology.

DETAILED DESCRIPTION

Figure 1:
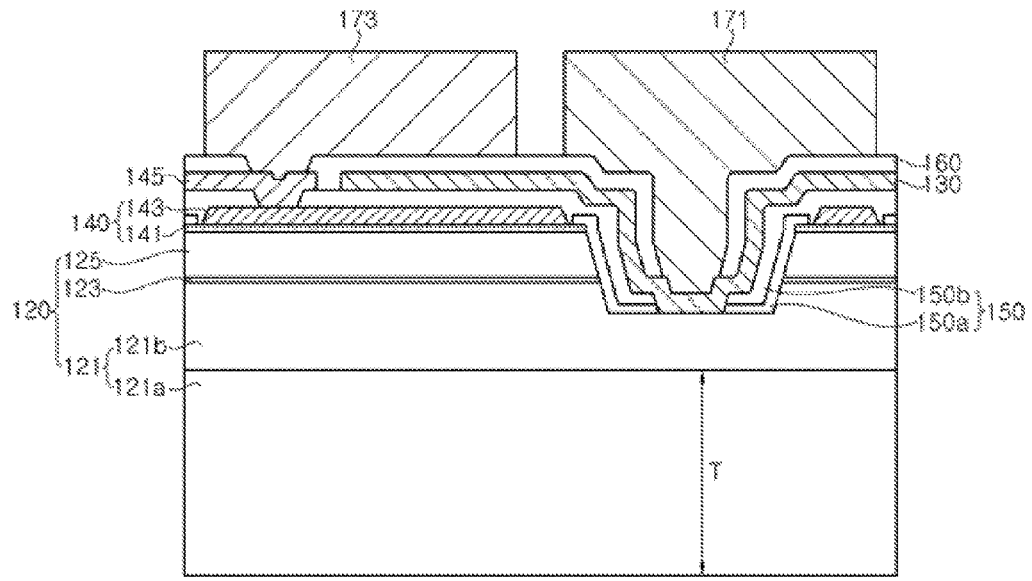
FIG. 1 is a sectional view of a light emitting diode according to one exemplary embodiment of the present disclosure.

Hereinafter, exemplary embodiments of the present disclosure will be described in detail with reference to the accompanying drawings. The term "exemplary" is used to mean "an example of" or "examples of" and may or may not mean an ideal or a preferred embodiment. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

A light emitting diode according to exemplary embodiments can be realized in various ways.

Figure 2:
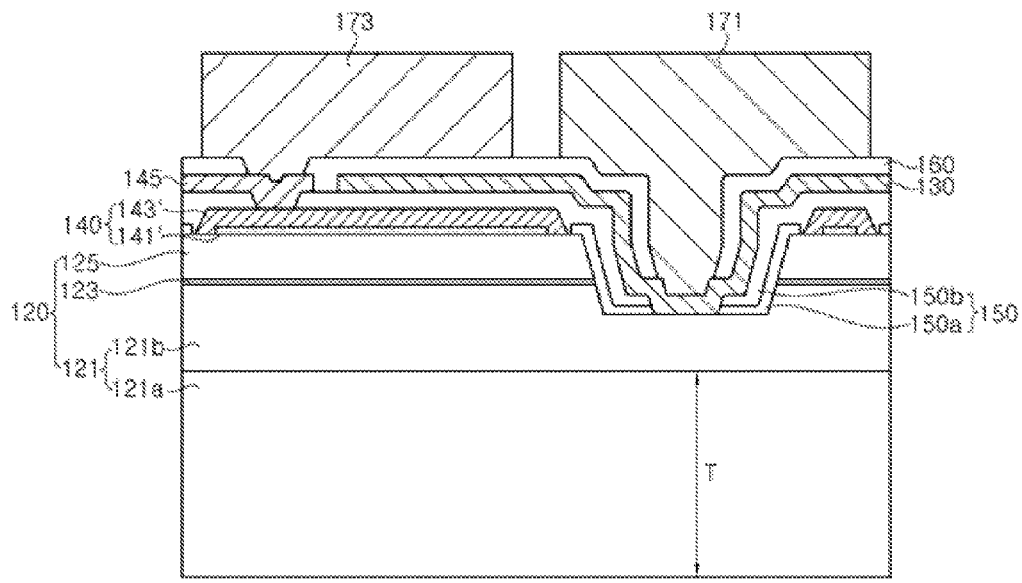
FIG. 2 is a sectional view of a light emitting diode according to another exemplary embodiment of the present disclosure.

FIG. 1 is a sectional view of a light emitting diode according to one exemplary embodiment of the present disclosure and FIG. 2 is a sectional view of a light emitting diode according to another exemplary embodiment of the present disclosure.

Referring to FIG. 1, a light emitting diode includes a light emitting structure 120, a first contact electrode 130, the second contact electrode 140, and insulation layers 150, 160. The light emitting diode may further include a connection electrode 145, a first pad electrode 171, and a second pad electrode 173.

The light emitting structure 120 may include a first conductive type semiconductor layer 121, an active layer 123 disposed on the first conductive type semiconductor layer 121, and a second conductive type semiconductor layer 125 disposed on the active layer 123. The first conductive type semiconductor layer 121 may include a growth substrate 121a and an upper first conductive type semiconductor layer 121b disposed on the growth substrate 121a.

Each of the first conductive type semiconductor layer 121, the active layer 123 and the second conductive type semiconductor layer 125 may include a III-V based compound semiconductor, for example, a nitride-based semiconductor such as (Al, Ga, In)N. The first conductive type semiconductor layer 121 may include an n-type dopant (for example, Si) and the second conductive type semiconductor layer 125 may include a p-type dopant (for example, Mg). Particularly, the upper first conductive type semiconductor layer 121b of the first conductive type semiconductor layer 121 may be doped with n-type dopants so as to become an n-type conductive semiconductor layer. Alternatively, the first and second conductive type semiconductor layers 121, 125 may be formed as different conductive type semiconductor layers from the aforementioned conductive type semiconductor layers. The active layer 123 may have a multi-quantum well (MQW) structure.

As the growth substrate 121a, any substrate capable of growing nitride-based semiconductor layers thereon may be used without limitation. For example, the growth substrate 121a may include a heterogeneous substrate, such as a sapphire substrate, a silicon substrate, a silicon carbide substrate, and a spinel substrate, or a homogeneous substrate, such as a gallium nitride substrate and an aluminum nitride substrate. Particularly, in this exemplary embodiment, the growth substrate 121a may be a homogenous substrate, such as a gallium nitride substrate, which is formed of the same kind of material as that of the upper first conductive type semiconductor layer 121b. When the growth substrate 121a is a nitride-based substrate, the growth substrate 121a may include a single crystal nitride-based semiconductor. The growth substrate 121a may be doped with an n-type dopant to exhibit n-type conductivity, or may be undoped. However, since the nitride-based semiconductor exhibits n-type conductivity due to inherent defects such as nitrogen vacancies even in an undoped state, the undoped growth substrate 121a also exhibits n-type conductivity. Accordingly, the undoped growth substrate 121a may have the same conductive type as the upper first conductive type semiconductor layer 121b doped with the n-type dopant.

Semiconductor layers of the light emitting structure 120 may be grown on the growth substrate 121a. Accordingly, as described below, the semiconductor layers of the light emitting structure 120 may have the same growth planes. The growth substrate 121a may be separated and/or removed from the upper first conductive type semiconductor layer 121b after growth of the upper first conductive type semiconductor layer 121b, the active layer 123 and the second conductive type semiconductor layer 125.

The light emitting structure 120 has a non-polar or semi-polar growth plane. Thus, each of the first conductive type semiconductor layer 121, the active layer 123 and the second conductive type semiconductor layer 125 may also have a non-polar or semi-polar growth plane. Particularly, an upper surface of the second conductive type semiconductor layer 125 includes a non-polar or semi-polar growth plane. In this structure, separation between energy bands is reduced upon coupling between electrons and holes within the light emitting structure 120. Specifically, the growth planes of the semiconductor layers of the light emitting structure 120 may be non-polar planes, such as a-planes or m-planes, or semi-polar planes (for example, {20-2-1} or {30-3-1}). Such a non-polar or semi-polar growth plane of the semiconductor layers of the light emitting structure 120 may be realized by growing the upper first conductive type semiconductor layer 121b, the active layer 123 and the second conductive type semiconductor layer 125 on the growth substrate 121a having a non-polar or semi-polar growth plane.

Further, an upper surface of the growth substrate 121a, that is, a growth plane of the growth substrate 121a, may have a predetermined off-cut angle. For example, when the growth plane of the growth substrate 121a is an m-plane, the upper surface of the growth plane may have a predetermined off-cut angle in the c-direction (<0001> family of directions) and/or in the a-direction (<11-20> family of directions) with reference to the m-plane. Here, the c-direction and the a-direction are normal to the c-plane and the a-plane, respectively. The off-cut angle may range, for example, from −10° to +10°, without being limited thereto. The growth plane having an off-cut angle may also be a non-polar or semi-polar plane. A fine step is formed on the surface of the growth plane (for example, m-plane) having an off-cut angle and another crystal plane (for example, c-plane) may be exposed to a side surface of the step. Upon growth of nitride semiconductors on such a growth substrate 121a through vapor deposition, high coupling energy on the surface of the step promotes growth of the semiconductor layers. Accordingly, it is possible to increase a growth rate of nitride semiconductor layers through adjustment of the off-cut angle on the surface of the growth substrate 121a.

As used herein, the term "particular growth plane" includes the case where a predetermined off-cut angle is formed from the particular growth plane.

The growth substrate 121a may have a predetermined thickness T or more. The growth substrate 121a may have a thickness T of about 100 μm or more, for example, about 200 μm to 500 μm, specifically about 270 μm to about 330 μm. Within this thickness range of the growth substrate 121a, the light emitting diode can have improved luminous efficacy. Further, in the structure wherein the growth substrate 121a is a gallium nitride substrate, the growth substrate 121a has a thickness T of a predetermined value or more in order to reduce junction temperature $T_j$ of the light emitting diode through improvement in heat dissipation and heat distribution efficiency. As a result, the light emitting diode has improved luminous power and reliability.

Although the light emitting structure 120 is illustrated as including a non-polar or semi-polar homogeneous nitride-based substrate or as being grown on the non-polar or semi-polar homogeneous nitride-based substrate in this exemplary embodiment, it should be understood that other implementations are possible. Other types of substrates may also be applied to embodiments of the present disclosure without being limited to the homogeneous substrate so long as the substrate allows growth of the light emitting structure 120 thereon such that the light emitting structure 120 has a semi-polar or non-polar growth plane. Furthermore, if a heterogeneous substrate is used as the growth substrate, the growth substrate may be separated and removed from the light emitting structure 120 after completion of growth of the light emitting structure 120. Here, even in the case where the growth substrate is separated from the light emitting structure 120, the first conductive type semiconductor layer 121 on the heterogeneous substrate is formed to a thickness greater than or equal to the thickness T of the growth substrate 121a, thereby similarly realizing the effect of increasing luminous power in proportion to the thickness of the growth substrate 121a.

On the other hand, the growth substrate 121a may be composed of a single crystal including a nitride-based material. For example, the growth substrate 121a may be formed of a GaN single crystal material. In addition, the growth substrate 121a may have a thread dislocation density of a predetermined value or less and an oxygen impurity concentration of a predetermined value or less.

Specifically, the growth substrate 121a may have a thread dislocation density of $10^4$ cm$^{-2}$ or less, for example, $10^3$ cm$^{-2}$ or less, specifically $10^2$ cm$^{-2}$ or less. As such, the light emitting diode is manufactured using the growth substrate 121a having a relatively low thread dislocation density, so that the thread dislocation density of semiconductor layers grown on the growth substrate can be reduced, thereby improving quantum efficiency and antistatic discharge of the light emitting diode. In addition, the growth substrate 121a may have an oxygen impurity concentration of $10^{19}$ cm$^{-3}$ or less, specifically $3 \times 10^{17}$ cm$^{-3}$ or less. Further, the growth substrate 121a may have an optical extinction coefficient of less than 5 cm$^{-1}$ at a wavelength of 465 nm to 700 nm.

The growth substrate 121a having the aforementioned characteristics may be formed through single crystal growth using a solvothermal method, for example, an ammonothermal method. Hereinafter, referring to FIG. 6 to FIG. 8, the growth substrate 121a for light emitting diodes according to various exemplary embodiments and methods of fabricating the same will be described in detail.

Figure 6:
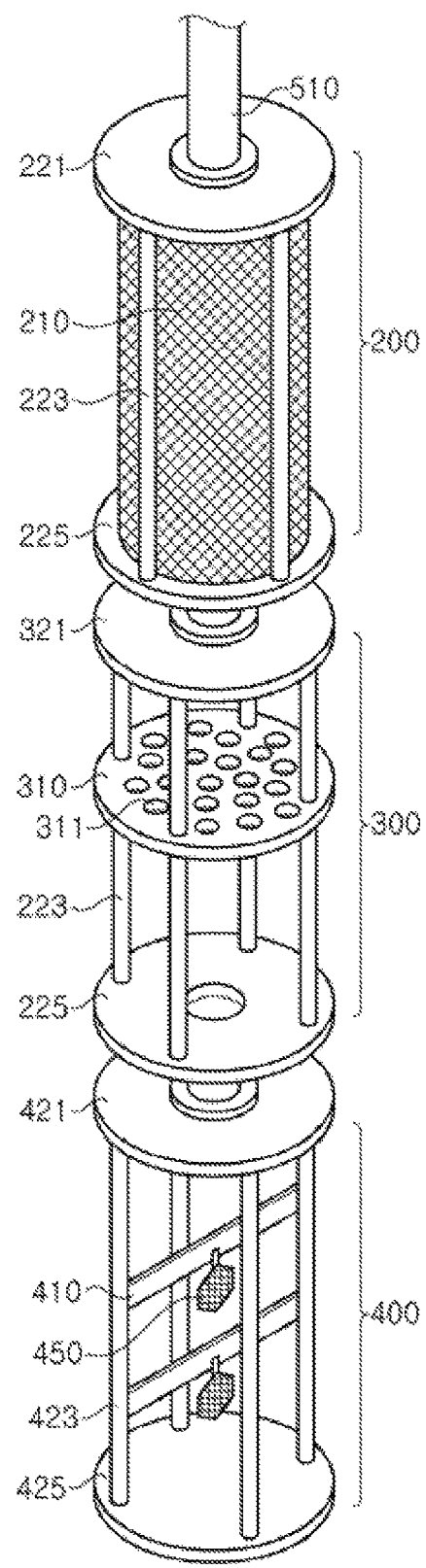
FIG. 6 and FIG. 7 are a perspective view and a sectional view of a single crystal growth apparatus capable of growing a growth substrate according to another exemplary embodiment of the present disclosure.
Figure 7:
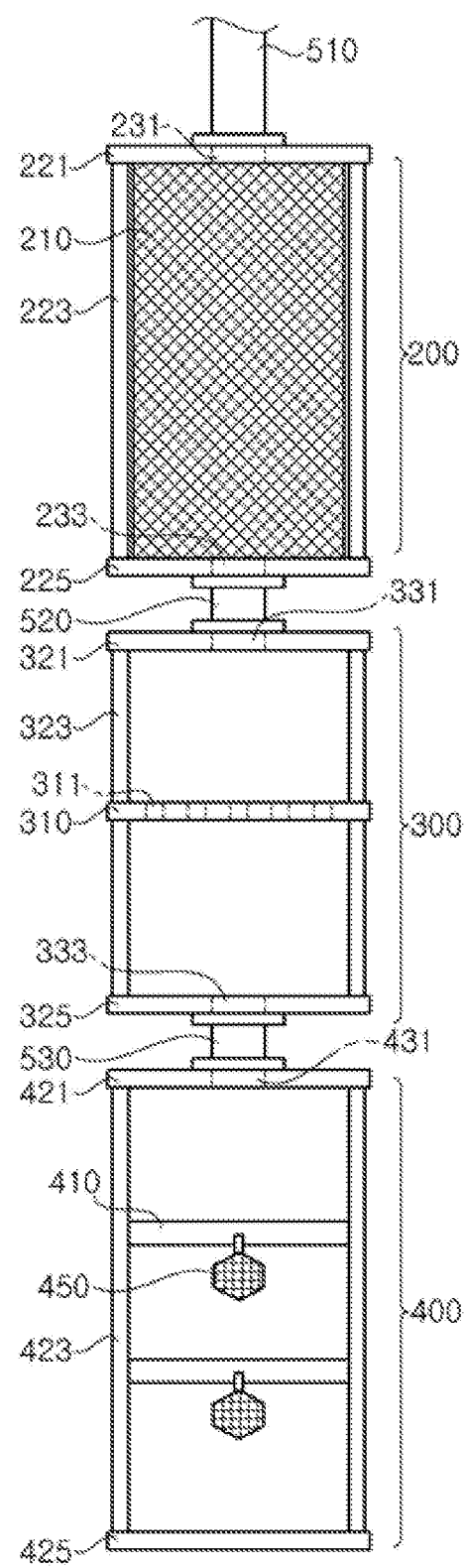
Figure 8:
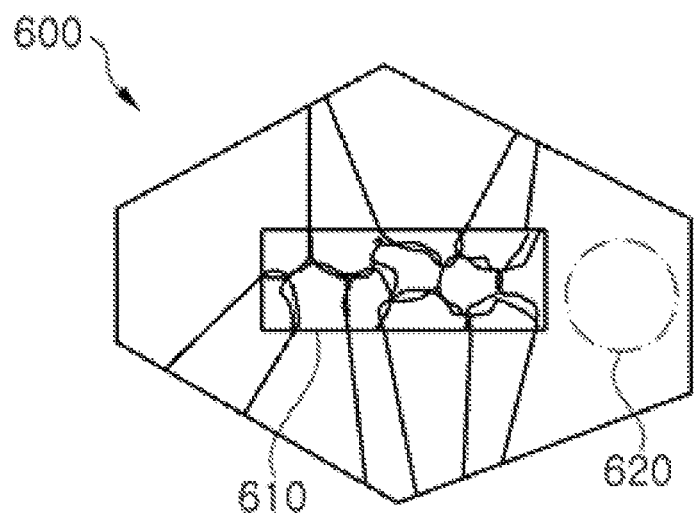
FIG. 8 is a diagram illustrating a seed crystal applied to the single crystal growth apparatus according to another exemplary embodiment of the present disclosure.

FIG. 6 and FIG. 7 are a perspective view and a sectional view of a single crystal growth apparatus capable of growing a growth substrate according to another exemplary embodiment of the present disclosure, and FIG. 8 is a diagram illustrating a seed crystal applied to the single crystal growth apparatus according to another exemplary embodiment of the present disclosure. In FIG. 6 and FIG. 7, a reaction container, a gasket, a first heater and a second heater are omitted for illustration of a source material storage unit 200, an adjustment unit 300 and a seed holder 400.

Referring to FIG. 6 and FIG. 7, the single crystal growth apparatus according to this exemplary embodiment includes the source material storage unit 200, the adjustment unit 300 the seed holder 400, the reaction container, and the heaters. In this exemplary embodiment, the source material storage unit 200, the adjustment unit 300 and the seed holder 400 may be arranged inside the reaction container (not shown). The source material storage unit 200 may be placed at an upper portion of the reaction container and the seed holder 400 may be placed at a lower portion of the reaction container.

The adjustment unit 300 may be disposed between the source material storage unit 200 and the seed holder 400 such that the source material storage unit 200 is placed above the adjustment unit 300 and the seed holder 400 is placed below the adjustment unit 300. Alternatively, the locations of the source material storage unit 200 and the seed holder 400 may be interchanged.

The source material storage unit 200 may include a source material storage basket 210 disposed therein, and may further include an upper plate 221, support columns 223 and a lower plate 225. The source material storage basket 210 may have a mesh shape and be configured to receive source materials for crystals to be grown therein. The source material storage basket 210 may be formed of a material, for example, Ni or a Ni alloy, which is not deformed by temperature and pressure applied upon operation of the single crystal growth apparatus. Upon single crystal growth using the single crystal growth apparatus, the source material storage unit 200 may store GaN sources, a solvent, a mineralizing agent, dopant sources, and the like. The solvent may be a supercritical fluid and may include, for example, ammonia, hydrazine, methylamine, ethyl diamine, melamine, or other nitrogen-containing fluids. The upper plate 221 and the lower plate 225 are disposed on upper and lower sides of the source material storage unit 200, respectively, and may be secured to each other by the support columns 223. The source material storage basket 210 may be disposed in a region defined by the upper plate 221, the lower plate 225 and the support columns 223.

In order to adjust the oxygen impurity concentration of the growth substrate 121a fabricated using the single crystal growth apparatus according to this exemplary embodiment, oxygen impurity concentrations of sources (the GaN sources, the solvent, the mineralizing agent, the dopant sources, and the like) supplied to the source material storage unit 200 are controlled. For example, in order to adjust the oxygen impurity concentration of a single crystal (corresponding to the growth substrate 121a) grown by the apparatus to $10^{19}$ cm$^{-3}$ or less, the oxygen content relative to the total weight of the sources may be controlled to 15 ppm or less. Furthermore, in order to adjust the oxygen impurity concentration of the single crystal grown by the apparatus to $3 \times 10^{17}$ cm$^{-3}$ or less, the oxygen content relative to the total weight of the sources may be controlled to 1.5 ppm or less. Obviously, other implementations are also possible.

The adjustment unit 300 includes an adjustment plate 310 and may further include an upper plate 321, support columns 323 and a lower plate 325. The adjustment plate 310 is disposed between the upper plate 321 and the lower plate 325 and may be secured by the support columns 323. The adjustment plate 310 may include one or more through-holes 311 formed in a vertical direction such that the source materials for crystal growth supplied from the source material storage unit 200 flow downwards through the through-holes 311. As shown in FIG. 6 and FIG. 7, the adjustment plate 310 may include a plurality of through-holes 311 in order to secure a smooth flow of the sources materials for crystal growth. Height of the adjustment plate 310 may be adjusted so as to provide optimal conditions for growth of a single crystal having high quality and uniform crystallinity. In other exemplary embodiments, the adjustment unit 300 may include a plurality of adjustment plates 310 having the same structure as described above.

The seed holder 400 may include a support rack 410, and may further include a support plate 421, support columns 423, and a lower plate 425. The support rack 410 is secured to the support columns 423 to be disposed inside the seed holder 400. The seed holder may include one or more support racks 410 and the number and locations of support racks 410 and a distance between the support racks 410 may be adjusted given the size of a single crystal to be grown. As shown in the drawings, each of the supports rack 410 may be provided with a seed crystal 450 that acts as a seed of a single crystal to be grown.

The seed crystal 450 disposed inside the seed holder 400 may be a nitride-based single crystal having a thread dislocation density of less than about $10^8$ cm$^{-2}$. The seed crystal 450 may have a diameter of 1 mm or more, and may be a single crystal substantially free from tilt boundary. Since the seed crystal 450 is substantially free from tilt boundary and has a thread dislocation density of less than about $10^8$ cm$^{-2}$, a nitride-based single crystal grown from the seed crystal 450 may have a thread dislocation density of less than about $10^4$ cm$^{-2}$.

The seed crystal 450 may be fabricated by various single crystal growth methods, for example, MOCVD, HVPE, and the like. Particularly, in fabrication of the seed crystal 450 using HVPE, a seed crystal 450 having a thread dislocation density of less than about $10^8$ cm$^{-2}$ can be obtained. For example, as shown in FIG. 8, a single crystal grown by HVPE includes a high thread dislocation density region in which thread dislocations propagated from a particular region 610 are concentrated, and a low thread dislocation density region 620. In such a single crystal 600, a portion of the low thread dislocation density region 620 is processed to have a diameter of about 1 mm or more, thereby providing a seed crystal 450 having a thread dislocation density of less than about $10^8$ cm$^{-2}$.

Referring to FIG. 7 and FIG. 8 again, the source material storage unit 200, the adjustment unit 300, and the seed holder 400 may be connected to one another. The source material storage unit 200 and the adjustment unit 300 may be connected to each other through a second connection tube 520, and the adjustment unit 300 and the seed holder 400 may be connected to each other through a third connection tube 530. The single crystal growth apparatus according to this exemplary embodiment may further include a heater (not shown) disposed around the reaction container. The heater may be provided in plural and serves to adjust an inner temperature of the reaction container.

With the single crystal growth apparatus as described above, a nitride-based single crystal may be formed in an ingot shape or in a bulk shape from one seed crystal 450. The nitride-based single crystal having an ingot shape or a bulk shape is sliced into a substrate, thereby providing a growth substrate 121a having a thread dislocation density of $10^4$ cm$^{-2}$ or less and an oxygen impurity concentration of $10^{19}$ cm$^{-3}$ or less. In this exemplary embodiment, the growth substrate 121a may have a diameter of about 2 inches to about 6 inches.

It should be understood that other implementations are also possible. In another exemplary embodiment, the growth substrate 121a may be fabricated by forming a single ingot or bulk through combination of a plurality of seed crystals 450 after growth thereof. That is, in this exemplary embodiment, the single crystal ingot or bulk may be fabricated through combination of multiple growth centers (seed crystals 450) into a single crystal.

As the semiconductor layers of the light emitting structure 120 are grown from such a growth substrate 121a, it is possible to reduce density of defects in the light emitting structure 120, which are created and propagated from defects of the growth substrate 121a, for example, thread dislocations, grain boundaries, and tilt boundaries. Further, as the oxygen impurity concentration of the nitride-based single crystal increases, the single crystal exhibits a yellow color and suffers from deterioration in light transmittance. According to this exemplary embodiment, the light emitting structure 120 includes the growth substrate 121a having an oxygen impurity concentration of a predetermined value or less, thereby minimizing light loss caused by oxygen impurities. Particularly, in some exemplary embodiments, the growth substrate 121a of the light emitting diode is placed in a light emission path, thereby improving luminous efficacy through reduction in light loss caused by oxygen impurities.

Referring to FIG. 1 again, the light emitting structure 120 may include a partially exposed region of an upper surface of the first conductive type semiconductor layer 121. The partially exposed region of the upper surface of the first conductive type semiconductor layer 121 may be formed by partially removing the second conductive type semiconductor layer 125 and the active layer 123. As shown therein, the upper surface of the first conductive type semiconductor layer 121 may be partially exposed through a hole formed through the second conductive type semiconductor layer 125 and the active layer 123. The hole may have an inclined side surface. The hole may be provided in plural and it should be understood that the shape and arrangement of holes are not limited to the structure as shown in FIG. 1. In addition, the partially exposed region of the first conductive type semiconductor layer 121 may be provided by partially removing the second conductive type semiconductor layer 125 and the active layer 123 so as to form a mesa including the second conductive type semiconductor layer 125 and the active layer 123.

The light emitting structure 120 may further include a rough surface formed by increasing roughness of a lower surface thereof. The rough surface may be formed by at least one of wet etching, dry etching, and electrochemical etching. For example, the rough surface may be formed by photo-enhanced chemical (PEC) etching or by an etching process using an etching solution containing KOH and NaOH. As a result, the light emitting structure 120 may include bumps and depressions formed on the lower surface of the first conductive type semiconductor layer 121 and having a micrometer to nanometer scale. The rough surface of the first conductive type semiconductor layer can improve light extraction efficiency of the light emitting structure 120.

The second contact electrode 140 is disposed on the second conductive type semiconductor layer 125 to form ohmic contact with the second conductive type semiconductor layer 125. The second contact electrode 140 includes a conductive oxide layer 141 and a reflective electrode layer 143 disposed on the conductive oxide layer 141. The conductive oxide layer 141 may contact the second conductive type semiconductor layer 125. That is, the conductive oxide layer 141 may form ohmic contact with the second conductive type semiconductor layer 125 having a non-polar or semi-polar growth plane. The reflective electrode layer 143 is disposed on the conductive oxide layer 141 and may have a smaller area than the conductive oxide layer 141. Accordingly, the reflective electrode layer 143 may be disposed within an outer peripheral region of the conductive oxide layer 141.

The conductive oxide layer 141 may include ITO, IZO, IZTO, IAZO, IGZO, IGTO, AZO, IrO$_x$, RuO$_x$, RuO$_x$/ITO, MgO, ZnO, and the like. Particularly, the conductive oxide layer 141 may be formed of ITO. In this exemplary embodiment, contact resistance between the conductive oxide layer 141 and the second conductive type semiconductor layer 125 may be lower than the contact resistance between a metal (for example, Ag) and the second conductive type semiconductor layer 125. Although the thickness of the conductive oxide layer 141 is not limited to a particular value, the thickness of the conductive oxide layer 141 may be optimally determined so as to provide low contact resistance between the second contact electrode 140 and the second conductive type semiconductor layer 125 without significantly deteriorating luminous efficacy of the light emitting diode. For example, the conductive oxide layer 141 may have a thickness of about 50 Å to 400 Å. Particularly, the conductive oxide layer 141 may be formed of ITO having a thickness of 50 Å to 150 Å. However, it should be understood that other implementations are also possible.

The reflective electrode layer 143 may include a metallic material exhibiting high reflectivity with respect to light. The metallic material may be selected in various ways depending upon wavelengths of light emitted from the light emitting diode. The reflective electrode layer 143 may include a reflective layer and a cover layer covering the reflective layer. For example, the reflective layer may include at least one selected from among Ni, Pt, Pd, Rh, W, Ti, Al, Mg, Ag and Au. The reflective layer may be formed by sputtering, e-beam evaporation, and the like. For example, upon formation of the reflective layer by sputtering, the reflective layer may be formed to have a gradually decreasing thickness from an inner peripheral region to an outer peripheral region. The reflective layer may be composed of a single layer or multiple layers. The cover layer can prevent interdiffusion of materials between the reflective layer and other layers and can prevent external materials from diffusing into and damaging the reflective layer. The cover layer may include, for example, Au, Ni, Ti, Cr, and the like, and may be composed of a single layer or multiple layers.

The second conductive type semiconductor layer 125 has a non-polar or semi-polar growth plane, and a p-type nitride-based semiconductor layer having a non-polar or semi-polar growth plane is unlikely to form ohmic contact with a metallic material or has high contact resistance even in the case of forming ohmic contact therewith. According to this exemplary embodiment, the second contact electrode 140 includes the conductive oxide layer 141 contacting the second conductive type semiconductor layer 125 and thus can form ohmic contact of low contact resistance with the second conductive type semiconductor layer 125 having the non-polar or semi-polar growth plane. In addition, since the reflective electrode layer 143 is not required to form direct ohmic contact with the second conductive type semiconductor layer 125, an annealing process so as to allow the reflective electrode layer 143 to form ohmic contact with the second conductive type semiconductor layer 125 can be omitted. Accordingly, it is possible to prevent deterioration in reflectivity due to damage to the reflective electrode layer 143 during annealing.

Further, the second contact electrode 140 may at least partially cover an upper surface of the second conductive type semiconductor layer 125, or may cover the overall upper surface of the second conductive type semiconductor layer 125. Alternatively, the second contact electrode 140 may be formed in a monolithic structure so as to cover the upper surface of the second conductive type semiconductor layer 125 in a remaining region excluding a region corresponding to the exposed region of the first conductive type semiconductor layer 121 of the light emitting structure 120. With this structure, the second contact electrode 140 can uniformly supply electric current to the entirety of the light emitting structure 120, thereby improving current spreading efficiency. Obviously, other implementations are also possible. In some exemplary embodiments, the second contact electrode 140 may include a plurality of unit electrodes.

Particularly, the conductive oxide layer 141 of the second contact electrode 140 may cover substantially the entirety of the upper surface of the second conductive type semiconductor layer 125. For example, the conductive oxide layer 141 may cover 90% or more of the upper surface of the second conductive type semiconductor layer 125. After formation of the light emitting structure 120, the conductive oxide layer 141 may be formed over the entire upper surface of the light emitting structure 120 and may be subjected to etching together with the second conductive type semiconductor layer 125 and the active layer 123 during an etching process to expose the first conductive type semiconductor layer 121. On the other hand, when a contact electrode of a metallic material is formed on the second conductive type semiconductor layer 125 through deposition or plating, the contact electrode can be placed within a region separated a predetermined distance from an outer periphery of the upper surface of the second conductive type semiconductor layer 125 due to process margin of a mask. Thus, if the conductive oxide layer 141 is formed as a portion forming ohmic contact with the second contact electrode 140, the distance from the contact electrode to the outer periphery of the upper surface of the second conductive type semiconductor layer 125 can be reduced, as compared with the case where the contact electrode is formed of a metallic material. A contact area between the second conductive type semiconductor layer 125 and the second contact electrode 140 can be relatively increased, thereby reducing forward voltage $V_f$ of the light emitting diode. In addition, since the conductive oxide layer 141 is closer to the periphery of the second conductive type semiconductor layer 125 than the metallic material, the shortest distance from a portion at which the second contact electrode 140 contacts the second conductive type semiconductor layer 125 to a portion at which the first contact electrode 130 contacts the first conductive type semiconductor layer 121 can also be decreased, thereby further reducing forward voltage $V_f$ of the light emitting diode.

Obviously, other implementations are also possible. Alternatively, as shown in FIG. 2, the reflective electrode layer 143 may be formed to cover a side surface of the conductive oxide layer 141. The light emitting diode of FIG. 2 is generally the same as the light emitting diode of FIG. 1 excluding the structure of the second contact electrode 140, and a detailed description thereof will thus be omitted.

Referring to FIG. 1 again, the insulation layers 150, 160 insulate the first contact electrode 130 and the second contact electrode 140 from each other. The insulation layers 150, 160 are disposed on the light emitting structure 120 and may partially cover the first and second contact electrodes 130, 140. The insulation layers 150, 160 may include a first insulation layer 150 and a second insulation layer 160. Hereinafter, the first insulation layer 150 will be described first and the second insulation layer 160 will be described below.

The first insulation layer 150 may partially cover the upper surface of the light emitting structure 120 and the second contact electrode 140. Further, the first insulation layer 150 may cover a side surface of the hole which partially exposes the first conductive type semiconductor layer 121, while at least partially exposing the first conductive type semiconductor layer 121 exposed through the hole. The first insulation layer 150 may include an opening formed at a location corresponding to the hole and an opening that exposes a portion of the second contact electrode 140. The first conductive type semiconductor layer 121 and the second contact electrode 140 can be partially exposed through the openings. Particularly, a portion of the reflective electrode layer 143 of the second contact electrode 140 can be exposed.

The first insulation layer 150 may include an insulation material, for example, $SiO_2$, $SiN_x$, $MgF_2$, and the like. The first insulation layer 150 may include multiple layers and may include a distributed Bragg reflector in which materials having different indices of refraction are alternately stacked one above another.

In other exemplary embodiments, the first insulation layer 150 may further cover a side surface of at least part of the light emitting structure 120. A coverage rate of the first insulation layer 150 on the side surface of the light emitting structure 120 may differ depending upon isolation into unit chips in fabrication of the light emitting diode. That is, as in the above exemplary embodiment, the first insulation layer 150 may cover only the upper surface of the light emitting structure 120. Alternatively, when the first insulation layer 150 is formed after isolation of the wafer into unit chips in fabrication of the light emitting diode, the first insulation layer 150 may also cover not only the upper surface of the light emitting structure 120 but also the side surface of the light emitting structure 120.

The first insulation layer 150 may cover a pre-insulation layer 150a and a main insulation layer 150b. In formation of the first insulation layer 150, the pre-insulation layer 150a may be formed prior to the main insulation layer 150b so that the pre-insulation layer 150a can be placed under the first insulation layer 150.

Specifically, the pre-insulation layer 150a may cover a portion of the light emitting structure 120, and may also cover a portion of an upper surface of the second contact electrode 140 and a side surface of the second contact electrode 140. In this exemplary embodiment, the pre-insulation layer 150a may cover a side surface and a portion of an upper surface of the conductive oxide layer 141 of the second contact electrode 140, and includes an opening that partially exposes the conductive oxide layer 141. The reflective electrode layer 143 may be formed on the conductive oxide layer 141 exposed through the opening. In this exemplary embodiment, the reflective electrode layer 143 is separated from the pre-insulation layer 150a so as not to contact each other. Alternatively, the pre-insulation layer 150a may contact the reflective electrode layer 143 according to a process of forming the reflective electrode layer 143. The main insulation layer 150b is formed on the pre-insulation layer 150a and partially covers the reflective electrode layer 143. In a structure wherein the reflective electrode layer 143 does not adjoin the pre-insulation layer 150a, the pre-insulation layer 150a is not interposed between the reflective electrode layer 143 and the main insulation layer 150b.

The pre-insulation layer 150a and the main insulation layer 150b may be formed of the same material, and may include, for example, $SiO_2$. The pre-insulation layer 150a may have a greater thickness than the conductive oxide layer 141.

The pre-insulation layer 150a may be formed during formation of the second contact electrode 140. For example, with the conductive oxide layer 141 formed on the second conductive type semiconductor layer 125, the pre-insulation layer 150a is formed before formation of the reflective electrode layer 143. In this exemplary embodiment, the pre-insulation layer 150a may be formed to a thickness of about 1,000 Å. The pre-insulation layer 150a may be formed to cover the side surface of the hole, through which the first conductive type semiconductor layer 121 is exposed, and a portion of the conductive oxide layer 141. Here, the pre-insulation layer 150a partially covers conductive oxide layer 141 excluding a region of the conductive oxide layer 141, in which a second contact electrode 143 will be formed, such that the opening partially exposing the conductive oxide layer 141 is formed. Thereafter, the reflective electrode layer 143 is formed on the opening through which the conductive oxide layer 141 is exposed. The reflective electrode layer 143 may be separated from or bonded to the pre-insulation layer 150a. In this way, the pre-insulation layer 150a is formed prior to the reflective electrode layer 143, thereby preventing reflectivity reduction and resistance increase of the reflective electrode layer 143 caused by interdiffusion of materials between the reflective electrode layer 143 and the light emitting structure 120. After the reflective electrode layer 143 is formed on the conductive oxide layer 141, the main insulation layer 150b is formed on the pre-insulation layer 150a so as to partially cover the reflective electrode layer 143, thereby forming the first insulation layer 150.

In the exemplary embodiment of FIG. 2 wherein a reflective electrode layer 143' is formed to cover a conductive oxide layer 141', the pre-insulation layer 150a may be formed only on the light emitting structure 120 instead of partially covering the conductive oxide layer 141'.

The first contact electrode 130 may partially cover the light emitting structure 120. In addition, the first contact electrode 130 forms ohmic contact with the first conductive type semiconductor layer 121 through the partially exposed surface of the first conductive type semiconductor layer 121. As in this exemplary embodiment, in the structure the exposed region of the first conductive type semiconductor layer 121 is formed in a hole shape, the first contact electrode 130 forms ohmic contact with the first conductive type semiconductor layer 121 through the opening of the first insulation layer 150 placed corresponding to the hole. Further, the first contact electrode 130 may be formed to cover the entire upper surface of the first insulation layer 150 excluding some region thereof. In this structure, light can be reflected by the first contact electrode 130. Further, the first contact electrode 130 is spaced apart from the second contact electrode 140 via the first insulation layer 150 so as to be electrically insulated therefrom.

The structure wherein the first contact electrode 130 is formed to cover the entire upper surface of the light emitting structure 120 excluding some region thereof can further improve current spreading efficiency of the light emitting diode. Further, a portion of the light emitting structure not covered by the second contact electrode 140 can be covered by the first contact electrode 130, thereby improving luminous efficacy of the light emitting diode through more effective reflection of light.

As described above, the first contact electrode 130 can form ohmic contact with the first conductive type semiconductor layer 121 while serving to reflect light. Thus, the first contact electrode 130 may include a highly reflective metal layer such as an Al layer. The first contact electrode 130 may be composed of a single layer or multiple layers. The highly reflective metal layer may be formed on a bonding layer such as a Ti layer, a Cr layer or a Ni layer. Obviously, other implementations are also possible and the first contact electrode 130 may include at least one of Ni, Pt, Pd, Rh, W, Ti, Al, Mg, Ag and Au.

In other exemplary embodiments, the first contact electrode 130 may be formed to cover a side surface of the light emitting structure 120 as well as the upper surface thereof. In the structure wherein the first contact electrode 130 also covers the side surface of the light emitting structure 120, the first contact electrode 130 reflects light emitted through the side surface of the active layer 123 in an upward direction, thereby increasing the ratio of light emitted through an upper surface of the light emitting diode. In the structure wherein the first contact electrode 130 covers the side surface of the light emitting structure 120 as well as the upper surface thereof, the first insulation layer 150 may be interposed between the side surface of the light emitting structure 120 and the first contact electrode 130.

The light emitting diode may further include the connection electrode 145. The connection electrode 145 may be disposed on the second contact electrode 140 and may be electrically connected to the second contact electrode 140 through the opening of the first insulation layer 150. Further, the connection electrode 145 may electrically connect the second contact electrode 140 to the second pad electrode 173. Furthermore, the connection electrode 145 may be formed to partially cover the first insulation layer 150 and may be separated from the first contact electrode 130 to be insulated from each other. An upper surface of the connection electrode 145 may be flush with an upper surface of the first contact electrode 130. In addition, the connection electrode 145 may be formed by the same process as that of the first contact electrode 130, and the connection electrode 145 and the first contact electrode 130 may include the same materials. Alternatively, the connection electrode 145 and the first contact electrode 130 may include different materials.

The second insulation layer 160 may partially cover the first contact electrode 130 and may include a first opening 160a that partially exposes the first contact electrode 130 and a second opening 160b that partially exposes the second contact electrode 140. Each of the first and second openings 160a, 160b may be provided in plural.

The second insulation layer 160 may include an insulation material, for example, $SiO_2$, $SiN_x$, and $MgF_2$. Furthermore, the second insulation layer 160 may be composed of multiple layers and may include a distributed Bragg reflector in which materials having different indices of refraction are stacked one above another. In the structure wherein the second insulation layer 160 is composed of multiple layers, an uppermost layer of the second insulation layer 160 may be formed of $SiN_x$. The structure wherein the uppermost layer of the second insulation layer 160 is formed of $SiN_x$ can more effectively prevent moisture penetration into the light emitting structure 120. Alternatively, the second insulation layer 160 may be composed of a single layer of $SiN_x$. With a structure wherein the first insulation layer 150 is formed of $SiO_2$ and the second insulation layer 160 is formed of $SiN_x$, the light emitting diode can achieve improvement both in luminous efficacy and reliability. With the structure wherein the first insulation layer 150 formed of $SiO_2$ is formed under the first contact electrode 130, it is possible to maximize light refection efficiency of the light emitting diode through the first contact electrode 130 and the second contact electrode 140 while efficiently protecting the light emitting diode from external moisture using the second insulation layer 160 formed of $SiN_x$.

The first insulation layer 150 may have a greater thickness than the second insulation layer 160. The first insulation layer 150 is formed through two steps including formation of the pre-insulation layer 150a and thus can have a greater thickness than the second insulation layer 160. In this exemplary embodiment, the thickness of the main insulation layer 150b of the first insulation layer 150 may be substantially the same as the thickness of the second insulation layer 160, without being limited thereto.

The first and second pad electrodes 171, 173 are placed on the light emitting structure 120. The first and second pad electrodes 171, 173 are electrically connected to the first and the second contact electrodes 130, 140 through the first and second openings 160a, 160b, respectively. An external power source may be supplied to the light emitting structure 120 through the first and second pad electrodes 171, 173.

The first and second pad electrodes 171, 173 may be formed together by the same process, for example, photolithography and etching technology or lift-off technology. Each of the first and second pad electrodes 171, 173 may be composed of a single layer or multiple layers, and may include, for example, a bonding layer, such as a Ti layer, a Cr layer or a Ni layer, and a high conductivity metal layer such as an Al layer, a Cu layer, an Ag layer, or an Au layer.

This exemplary embodiment provides a light emitting diode that includes the light emitting structure 120 having a non-polar or semi-polar growth plane and the conductive oxide layer 141 forming ohmic contact with the light emitting structure 120. With this structure, the light emitting diode has high lateral current spreading efficiency upon high current operation, secures low contact resistance between contact electrodes and semiconductor layers so as to provide relatively low forward voltage $V_f$, and includes a nitride-based growth substrate having a predetermined thickness or more, thereby providing improved luminous power through improvement in current spreading efficiency and heat distribution efficiency.

Figure 3A:
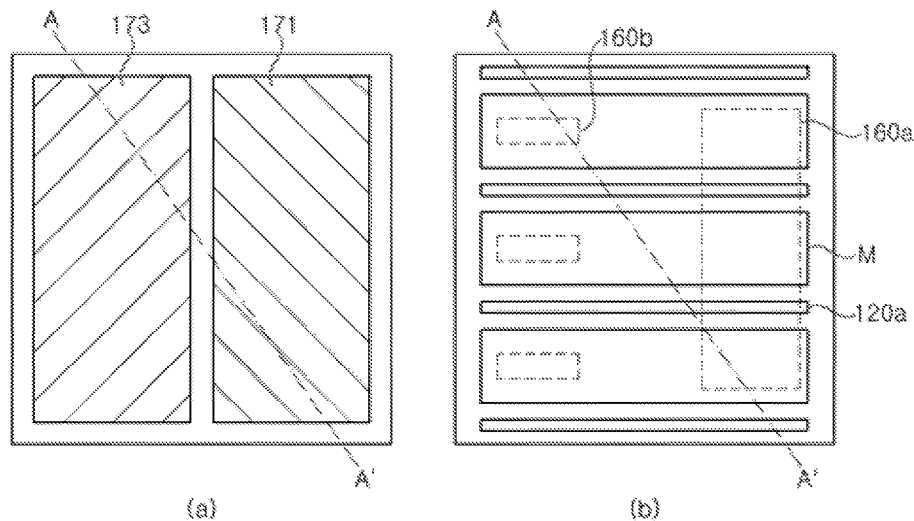
FIG. 3A and FIG. 3B are plan views and a sectional view of a light emitting diode according to a further exemplary embodiment of the present disclosure.
Figure 3B:
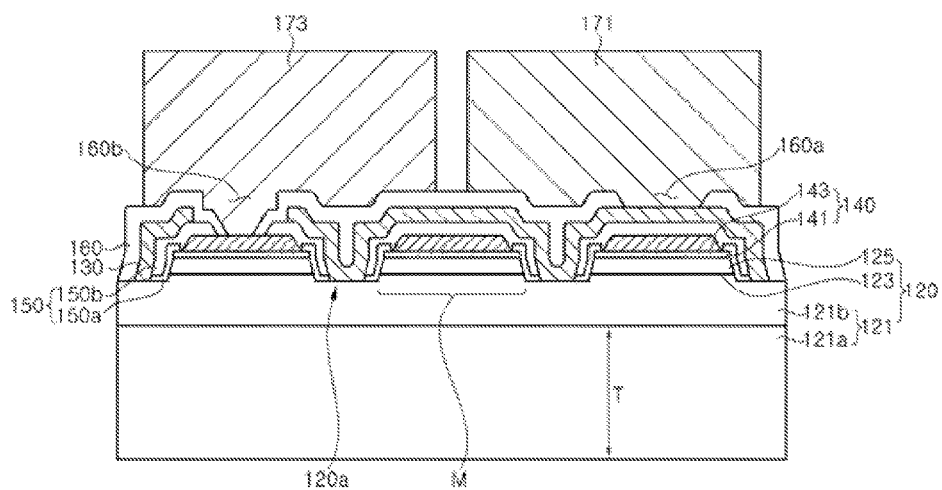

FIG. 3A and FIG. 3B are plan views and a sectional view of a light emitting diode according to a further exemplary embodiment of the present disclosure. In FIG. 3A, (a) is a plan view of the light emitting diode according to this exemplary embodiment and (b) is a plan view showing locations of mesas M and contact regions 120a in which the first conductive type semiconductor layer 121 forms ohmic contact with the first contact electrode 130. FIG. 3B is a cross-sectional view taken along line B-B' of FIG. 3A.

The light emitting diode of FIG. 3A and FIG. 3B is different from the light emitting diode of FIG. 1 in that the light emitting structure 120 includes a plurality of mesas M and exposed regions of the first conductive type semiconductor layer 121 formed around the mesas M and provides different arrangement of components depending upon the structure thereof. The following description will be mainly given of different features of the light emitting diode according to this exemplary embodiment, and detailed description of the same components will be omitted.

Referring to FIG. 3A and FIG. 3B, the light emitting diode according to this exemplary embodiment includes a light emitting structure 120, a first contact electrode 130, a second contact electrode 140, and insulation layers 150, 160. The light emitting diode may further include a connection electrode 145, a first pad electrode 171, and a second pad electrode 173.

The light emitting structure 120 may include a first conductive type semiconductor layer 121, an active layer 123 disposed on the first conductive type semiconductor layer 121, and a second conductive type semiconductor layer 125 disposed on the active layer 123. The first conductive type semiconductor layer 121 may include a growth substrate 121a and an upper first conductive type semiconductor layer 121b disposed on the growth substrate 121a. The growth substrate 121a may have a predetermined thickness T or more. The growth substrate 121a may have a thickness T of about 100 μm or more, for example, about 200 μm to 500 μm, specifically about 270 μm to about 330 μm.

Each of the semiconductor layers of the light emitting structure 120 has a non-polar or semi-polar growth plane.

The light emitting structure 120 includes a plurality of mesas M each including the second conductive type semiconductor layer 125 and the active layer 123. The plurality of mesas M may have an inclined side surface and may be formed by patterning the light emitting structure 120. Each of the mesas M may further include a portion of the first conductive type semiconductor layer 121. The plurality of mesas M may be disposed in various arrangements on the first conductive type semiconductor layer 121. For example, as shown in FIGS. 3A and 3B, the mesas M may be separated from each other and may have an elongated shape extending in one direction to be parallel to each other. However, it should be understood that the shape of the mesas M is not limited thereto. The light emitting structure may include exposed regions of the first conductive type semiconductor layer 121 around the plurality of mesas M.

The second contact electrode 140 is placed on the plurality of mesas M and forms ohmic contact with the second conductive type semiconductor layer 125. The second contact electrode 140 includes a conductive oxide layer 141 and a reflective electrode layer 143 disposed on the conductive oxide layer 141. The reflective electrode layer 143 is disposed on the conductive oxide layer 141 and may have a smaller area than the conductive oxide layer 141. Accordingly, the reflective electrode layer 143 may be disposed within an outer peripheral region of the conductive oxide layer 141. Alternatively, the reflective electrode layer 143 may be formed to cover a side surface of the conductive oxide layer 141 as well as an upper surface thereof.

The insulation layers 150, 160 insulate the first contact electrode 130 and the second contact electrode 140 from each other. The insulation layers 150, 160 are disposed on the light emitting structure 120 and may partially cover first and second contact electrodes 130, 140. Furthermore, the insulation layers 150, 160 may include a first insulation layer 150 and a second insulation layer 160.

The first insulation layer 150 partially covers an upper surface of the light emitting structure 120 and the second contact electrode 140, and covers side surfaces of the mesas M. Furthermore, the first insulation layer 150 may partially cover the partially exposed regions of the first conductive type semiconductor layer 121 while exposing a portion of the first conductive type semiconductor layer 121. That is, the first insulation layer 150 may include openings that partially expose the first conductive type semiconductor layer 121 and the second contact electrode 140.

The regions of the first conductive type semiconductor layer 121 exposed through the openings of the first insulation layer 150 can form ohmic contact with the first contact electrode 130 and can be defined as the contact regions 120a. The contact regions 120a may be placed around the plurality of mesas M and may have, for example, an elongated shape extending in the extending direction of the mesas M. The mesas M may be disposed between the contact regions 120a.

The first insulation layer 150 may include a pre-insulation layer 150a and a main insulation layer 150b, in which the pre-insulation layer 150a may partially cover the light emitting structure 120 and the conductive oxide layer 141.

The first contact electrode 130 may be placed on the first insulation layer 150 and may partially cover the light emitting structure 120. In addition, the first contact electrode 130 forms ohmic contact with the first conductive type semiconductor layer 121 through the partially exposed surface of the first conductive type semiconductor layer 121, that is, through the contact regions 120a. The first contact electrode 130 is formed to cover the entire upper surface of the light emitting structure 120 excluding some region thereof, thereby further improving current spreading efficiency. Alternatively, the first contact electrode 130 may be formed to cover the side surface of the light emitting structure 120.

The light emitting diode may further include a connection electrode (not shown). The connection electrode may be placed on the second contact electrode 140 and may be electrically connected to the second contact electrode 140 through the openings of the first insulation layer 150. An upper surface of the connection electrode may be generally flush with an upper surface of the first contact electrode 130. In addition, the connection electrode 145 and the first contact electrode 130 may be formed by the same process and may include the same materials.

The second insulation layer 160 may partially cover the first contact electrode 130 and may include a first opening 160a that partially exposes the first contact electrode 130 and a second opening 160b that partially exposes the second contact electrode 140. Each of the first and second openings 160a, 160b may be provided in plural and the second opening 160b may be placed on the mesas M.

The first and second pad electrodes 171, 173 may be electrically connected to the first and second contact electrodes 130, 140 through the first and second openings 160a, 160b, respectively. The first and second pad electrodes 171, 173 may be formed together by the same process, for example, photolithography and etching technology or lift-off technology. Each of the first and second pad electrodes 171, 173 may be composed of a single layer or multiple layers, and may include, for example, a bonding layer, such as a Ti layer, a Cr layer or a Ni layer, and a high conductivity metal layer such as an Al layer, a Cu layer, an Ag layer, or an Au layer.

Next, a method of fabricating the light emitting diode according to this exemplary embodiment will be described. The following description is provided for understanding of the present disclosure and does not limit the scope of the present disclosure.

First, the light emitting structure 120 is formed by growing the first conductive type semiconductor layer 121, the active layer 123 and the second conductive type semiconductor layer 125 on the growth substrate 121a by MOCVD or the like. Then, the conductive oxide layer 141 including indium tin oxide (ITO) is formed on the light emitting structure 120 by e-beam evaporation or sputtering. With a mask formed on the conductive oxide layer 141, the plurality of mesas M is formed by partially etching the conductive oxide layer 141 and the light emitting structure 120 through the mask. As a result, an outer periphery of the conductive oxide layer 141 may be formed corresponding to an outer periphery of upper surfaces of the mesas M. Thereafter, the second contact electrode 140 is formed by forming the reflective electrode layer 143 on the conductive oxide layer 141, and the first insulation layer 150 is formed to cover the light emitting structure 120 and the second contact electrode 140. For the structure wherein the first insulation layer 150 includes the pre-insulation layer 150a and the main insulation layer 150b, the process of forming the second contact electrode 140 and the process of forming the first insulation layer 150 may be combined, as described above. Thereafter, the contact regions 120a partially exposing the first conductive type semiconductor layer 121 are formed and the second contact electrode 140 is partially exposed by patterning the first insulation layer 150. Then, the first contact electrode 130 is formed on the first insulation layer 150 by plating, deposition, or the like. After formation of the first contact electrode 130, the second insulation layer 160 is formed to cover substantially an entire upper surface of the first contact electrode 130 and is subjected to patterning to form the first and second openings 160a, 160b. Thereafter, the first and second pad electrodes 171, 173 are formed on the openings 160a, 160b, thereby providing a light emitting diode as shown in FIG. 3A and FIG. 3B.

According to this exemplary embodiment, the plurality of mesas M and the contact regions 120a disposed around the mesas are formed, thereby achieving more efficient current spreading in the lateral direction upon high current operation of the light emitting diode.

Figure 4A:
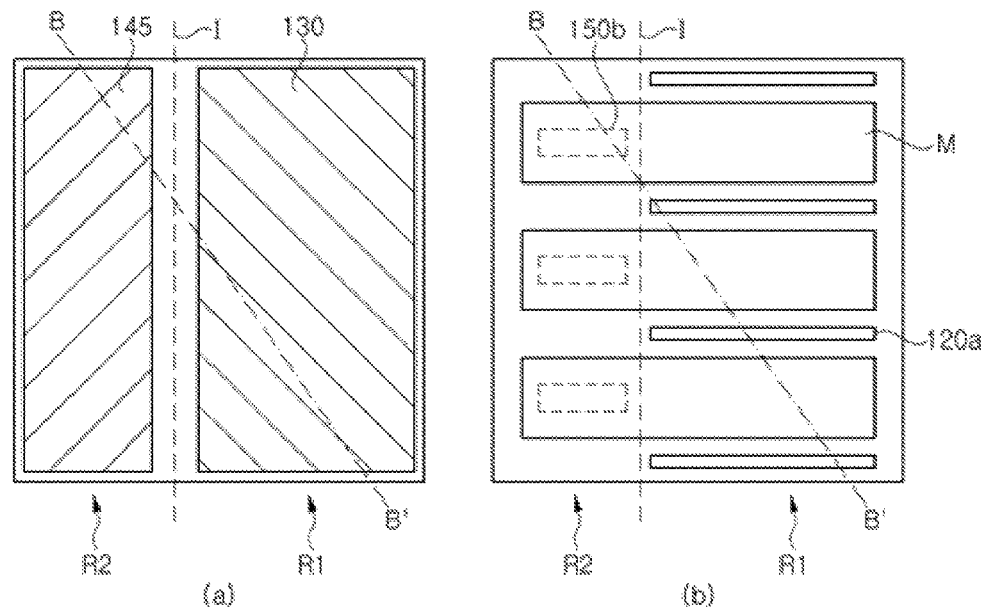
FIG. 4A and FIG. 4B are plan views and a sectional view of a light emitting diode according to yet another exemplary embodiment of the present disclosure.
Figure 4B:
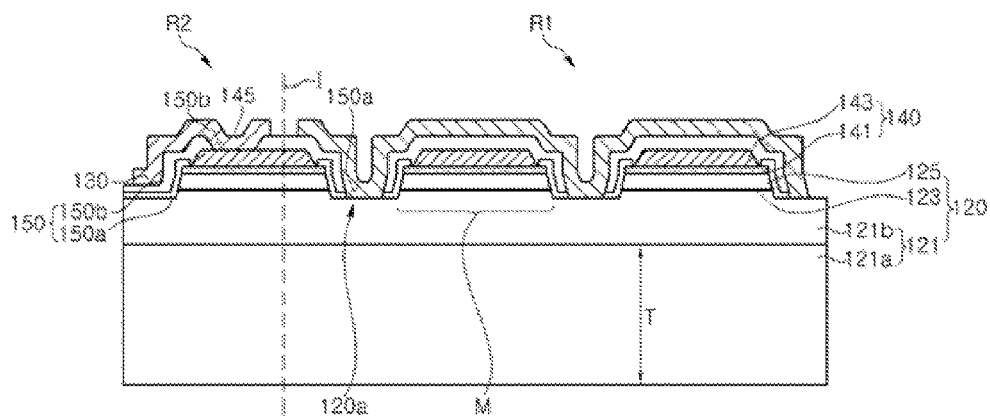

FIG. 4A and FIG. 4B are plan views and a sectional view of a light emitting diode according to yet another exemplary embodiment of the present disclosure.

FIG. 4A and FIG. 4B are plan views and a sectional view of a light emitting diode according to yet another exemplary embodiment of the present disclosure. In FIG. 4A, (a) is a plan view of the light emitting diode according to this exemplary embodiment and (b) is a plan view showing locations of mesas M and contact regions 120a in which the first conductive type semiconductor layer 121 forms ohmic contact with the first contact electrode 130. FIG. 4B is a cross-sectional view taken along line C-C' of FIG. 4A.

The light emitting diode shown in FIG. 4A and FIG. 4B is different from the light emitting diode shown in FIG. 3A and FIG. 3B in that the second insulation layer 160 and the first and second pad electrodes 171, 173 are omitted. The following description will be mainly given of different features of the light emitting diode according to this exemplary embodiment, and detailed description of the same components will be omitted.

Referring to FIG. 4A and FIG. 4B, the light emitting diode according to this exemplary embodiment includes a light emitting structure 120, a first contact electrode 130, a second contact electrode 140, a first insulation layer 150, and a connection electrode 145.

The first insulation layer 150 partially covers an upper surface of the light emitting structure 120 and the second contact electrode 140, and covers side surfaces of the mesas M. Furthermore, the first insulation layer 150 may partially cover a partially exposed region of the first conductive type semiconductor layer 121 while exposing a portion of the first conductive type semiconductor layer 121. That is, the first insulation layer 150 may include openings that partially expose the first conductive type semiconductor layer 121 and the second contact electrode 140. The regions of the first conductive type semiconductor layer 121 exposed through the openings of the first insulation layer 150 can form ohmic contact with the first contact electrode 130 and can be defined as contact regions 120a. The first insulation layer 150 may include a pre-insulation layer 150a, which may partially cover the light emitting structure 120 and the conductive oxide layer 141.

The first insulation layer 150 may include first openings 150a that expose some region of the first conductive type semiconductor layer 121, that is, the contact regions 120a, and second openings 150b that exposes some region of the second contact electrode 140. In a structure wherein the light emitting structure 120 is divided into at least two or more regions, the first openings 150a and the second openings 150b may be placed in different regions.

For example, the second opening 150b may be provided in plural so as to be placed on each of the mesas M. In this structure, the second openings 150b may be placed near one side of the light emitting structure 120. Conversely, the first openings 150a are placed near longer sides of the mesas M so as to be placed near the other side of the light emitting structure 120 opposite the one side of the light emitting structure. Assuming that the light emitting structure is divided into a first region R1 and a second region R2 with reference to an imaginary line I defined in a direction orthogonal to the extending direction of the mesas M, the first openings 150a may be placed within the first region R1 and the second openings 150b may be placed within the second region R2. In this structure, the first and section regions R1, R2 do not overlap each other. Accordingly, the first openings 150a and the second openings 150b are placed in different regions instead of being placed in the same region.

The first contact electrode 130 may be placed on the first insulation layer 150 and may partially cover the light emitting structure 120. In addition, the first contact electrode 130 forms ohmic contact with the first conductive type semiconductor layer 121 through the partially exposed surface of the first conductive type semiconductor layer 121, that is, through the contact regions 120a. On the other hand, the connection electrode 145 may be placed on the second contact electrode 140 and may be electrically connected to the second contact electrode 140 through the openings of the first insulation layer 150. An upper surface of the connection electrode 145 may be generally flush with an upper surface of the first contact electrode 130. In addition, the connection electrode 145 may be formed by the same process as that of the first contact electrode 130, and the connection electrode 145 and the first contact electrode 130 may include the same materials.

In the structure wherein the light emitting structure 120 is divided into at least two regions, the first contact electrode 130 and the connection electrode 145 may be placed in different regions. For example, as shown in FIG. 4A and FIG. 4B, the first contact electrode 130 may be placed in a first region R1 and the connection electrode 145 may be placed in a second region R2 such that the first contact electrode 130 and the connection electrode 145 are separated from each other. As such, since the first contact electrode 130 and the connection electrode 145 are placed in different regions to be separated from each other, the first contact electrode 130 and the connection electrode 145 can act as pad electrodes of the light emitting diode. Accordingly, the first contact electrode 130 can form ohmic contact with the first conductive type semiconductor layer 121 while acting as a first pad electrode, and the connection electrode 145 may be electrically connected to the second contact electrode 140 so as to act as a second pad electrode.

Next, a method of fabricating the light emitting diode according to this exemplary embodiment will be described. The following description is provided for understanding of the present disclosure and does not limit the scope of the present disclosure.

First, the light emitting structure 120 is formed by growing the first conductive type semiconductor layer 121, the active layer 123 and the second conductive type semiconductor layer 125 on the growth substrate 121a by MOCVD or the like. Then, the conductive oxide layer 141 including indium tin oxide (ITO) is formed on the light emitting structure 120 by e-beam evaporation or sputtering. With a mask formed on the conductive oxide layer 141, the plurality of mesas M is formed by partially etching the conductive oxide layer 141 and the light emitting structure 120 through the mask. As a result, an outer periphery of the conductive oxide layer 141 may be formed corresponding to an outer periphery of upper surfaces of the mesas M. Thereafter, the second contact electrode 140 is formed by forming the reflective electrode layer 143 on the conductive oxide layer 141, and the first insulation layer 150 is formed to cover the light emitting structure 120 and the second contact electrode 140. For the structure wherein the first insulation layer 150 includes the pre-insulation layer 150a and the main insulation layer 150b, the process of forming the second contact electrode 140 and the process of forming the first insulation layer 150 may be combined, as described above. Thereafter, the first openings 150a exposing the contact regions 120a of the first conductive type semiconductor layer 121 and the second openings 150b exposing a portion of the second contact electrode 140 are formed by patterning the first insulation layer 150. Then, the first contact electrode 130 and the connection electrode 145 are formed on the first insulation layer 150 by plating, deposition, and the like. In this method, the first contact electrode 130 and the connection electrode 145 are formed to be separated from each other, thereby forming the light emitting diode, as shown in FIG. 4A and FIG. 4B.

According to this exemplary embodiment, the processes of forming the second insulation layer and the first and second pad electrodes are omitted, thereby simplifying manufacture of the light emitting diode. Particularly, it is possible to reduce the number of masks for processes.

Figure 5A:
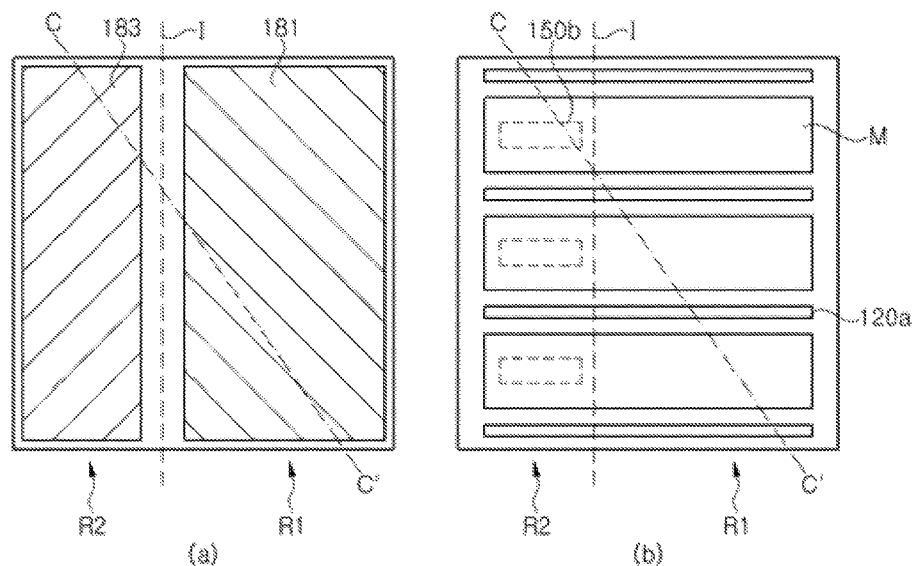
FIG. 5A and FIG. 5B are plan views and a sectional view of a light emitting diode according to yet another exemplary embodiment of the present disclosure.
Figure 5B:
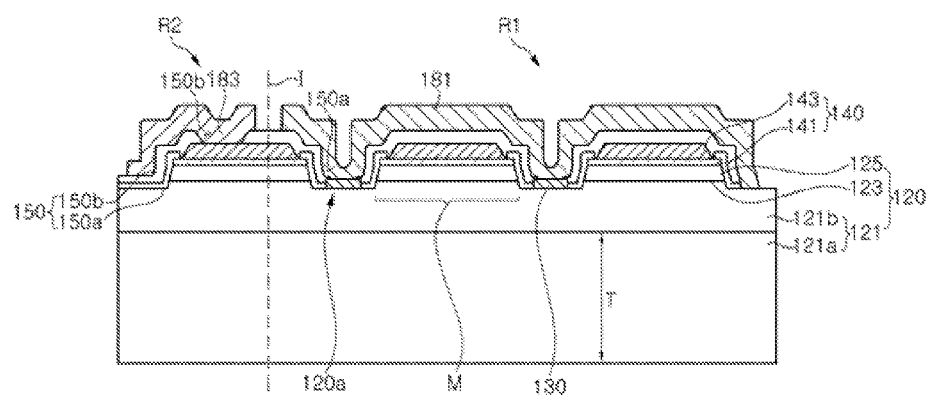

FIG. 5A and FIG. 5B are plan views and a sectional view of a light emitting diode according to yet another exemplary embodiment of the present disclosure.

FIG. 5A and FIG. 5B are plan views and a sectional view of a light emitting diode according to yet another exemplary embodiment of the present disclosure. In FIG. 5A, (a) is a plan view of the light emitting diode according to this exemplary embodiment and (b) is a plan view showing locations of mesas M and contact regions 120a in which the first conductive type semiconductor layer 121 forms ohmic contact with the first contact electrode 130. FIG. 5B is a cross-sectional view taken along line D-D' of FIG. 5A.

Unlike the light emitting diode shown in FIG. 4A and FIG. 4B, the light emitting diode of FIG. 5A and FIG. 5B further includes a first pad electrode 181 and a second pad electrode 183. The following description will be mainly given of different features of the light emitting diode according to this exemplary embodiment, and detailed description of the same components will be omitted.

Referring to FIG. 5A and FIG. 5B, the light emitting diode according to this exemplary embodiment includes a light emitting structure 120, a first contact electrode 130, a second contact electrode 140, a first insulation layer 150, and first and second pad electrodes 181, 183.

The first contact electrode 130 forms ohmic contact with a first conductive type semiconductor layer 121 through contact regions 120a. The first contact electrode 130 is placed on the first conductive type semiconductor layer 121 to be disposed in a region between the mesas M. Accordingly, in the light emitting diode according to this exemplary embodiment, the first contact electrode 130 is not placed on the mesas M, unlike the light emitting diodes of the exemplary embodiments described above.

The first pad electrode 181 may be placed on the first insulation layer 150 and may partially cover the light emitting structure 120. In addition, the first pad electrode 181 may partially cover the mesas M and is electrically connected to the first contact electrode 130 disposed on the contact regions 120a. The second pad electrode 183 may be disposed on the second contact electrode 140 and may be electrically connected to the second contact electrode 140 through second openings 150b of the first insulation layer 150. An upper surface of the second pad electrode 183 may be generally flush with an upper surface of the first pad electrode 183. In addition, the first and second pad electrodes 181, 183 may be formed by the same process and may include the same materials. Further, each of the first and second pad electrodes 181, 183 may be composed of a single layer or multiple layers.

In the structure wherein the light emitting structure 120 is divided into at least two or more regions, the first pad electrode 181 and the second pad electrode 183 may be placed in different regions. For example, as shown in FIG. 5A and FIG. 5B, the first pad electrode 181 may be placed in a first region R1 and the second pad electrode 183 may be placed in a second region R2 such that the first pad electrode 181 and the second pad electrode 183 are separated from each other.

Next, a method of fabricating the light emitting diode according to this exemplary embodiment will be described. The following description is provided for understanding of the present disclosure and does not limit the scope of the present disclosure.

First, the light emitting structure 120 is formed by growing the first conductive type semiconductor layer 121, the active layer 123 and the second conductive type semiconductor layer 125 on the growth substrate 121a by MOCVD or the like. Then, the conductive oxide layer 141 including indium tin oxide (ITO) is formed on the light emitting structure 120 by e-beam evaporation or sputtering. With a mask formed on the conductive oxide layer 141, the plurality of mesas M is formed by partially etching the conductive oxide layer 141 and the light emitting structure 120 through the mask. As a result, an outer periphery of the conductive oxide layer 141 may be formed substantially corresponding to an outer periphery of upper surfaces of the mesas M. Thereafter, the second contact electrode 140 is formed by forming the reflective electrode layer 143 on the conductive oxide layer 141, and the first contact electrode 130 is formed on a portion of the exposed region of the first conductive type semiconductor layer 121. The first contact electrode 130 and the second contact electrode 140 are formed by plating or deposition. Thereafter, the first insulation layer 150 is formed to cover the light emitting structure 120 and the first and second contact electrodes 130, 140. For the structure wherein the first insulation layer 150 includes the pre-insulation layer 150a and the main insulation layer 150b, the process of forming the second contact electrode 140 and the process of forming the first insulation layer 150 may be combined, as described above. Thereafter, the first openings 150a exposing at least part of the first contact electrode 130 and the second openings 150b exposing the second contact electrode 140 are formed by patterning the first insulation layer 150. Then, the first pad electrode 181 and the second pad electrode 183 are formed on the first insulation layer 150 by plating, deposition, and the like. In this method, the first and second pad electrodes 181, 183 are formed to be separated from each other, thereby forming the light emitting diode, as shown in FIG. 5A and FIG. 5B.

According to this exemplary embodiment, the process of forming the second insulation layer is omitted, thereby simplifying manufacture of the light emitting diode. Particularly, it is possible to reduce the number of masks for processes.

Figure 9:
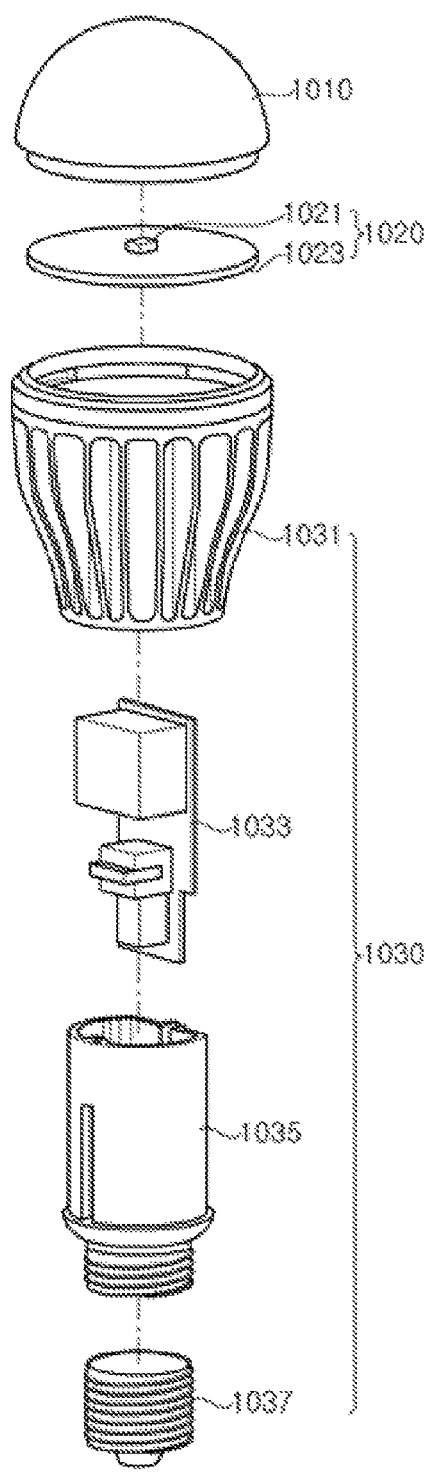
FIG. 9 is an exploded perspective view of one embodiment of a lighting apparatus to which a light emitting diode according to one exemplary embodiment of the present disclosure is applied.

FIG. 9 is an exploded perspective view of one embodiment of a lighting apparatus to which a light emitting diode according to one exemplary embodiment of the present disclosure is applied.

Referring to FIG. 9, the lighting apparatus according to this embodiment includes a diffusive cover 1010, a light emitting diode module 1020, and a body 1030. The body 1030 may receive the light emitting diode module 1020 and the diffusive cover 1010 may be disposed on the body 1030 so as to cover an upper side of the light emitting diode module 1020.

The body 1030 may have any shape so long as the body can supply electric power to the light emitting diode module 1020 while receiving and supporting the light emitting diode module 1020. For example, as shown in the drawing, the body 1030 may include a body case 1031, a power supply 1033, a power supply case 1035, and a power source connection section 1037.

The power supply 1033 is received in the power supply case 1035 to be electrically connected to the light emitting diode module 1020, and may include at least one IC chip. The IC chip may regulate, change or control electric power supplied to the light emitting diode module 1020. The power supply case 1035 may receive and support the power supply 1033. The power supply case 1035 having the power supply 1033 secured therein may be disposed within the body case 1031. The power source connection section 1037 is disposed at a lower end of the power supply case 1035 and is coupled thereto. Accordingly, the power source connection section 1037 is electrically connected to the power supply 1033 within the power supply case 1035 and may serve as a passage through which power can be supplied from an external power source to the power supply 1033.

The light emitting diode module 1020 includes a substrate 1023 and a light emitting diode 1021 disposed on the substrate 1023. The light emitting diode module 1020 may be disposed at an upper portion of the body case 1031 and be electrically connected to the power supply 1033.

As the substrate 1023, any substrate capable of supporting the light emitting diode 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting diode 1021 may include at least one of the light emitting diodes according to the embodiments described above.

The diffusive cover 1010 is disposed on the light emitting diode 1021 and may be secured to the body case 1031 to cover the light emitting diode 1021. The diffusive cover 1010 may be formed of a light-transmitting material and light orientation of the lighting apparatus may be adjusted through regulation of the shape and optical transmissivity of the diffusive cover 1010. As such, the diffusive cover 1010 may be modified in various shapes depending on usage and applications of the lighting apparatus.

Figure 10:
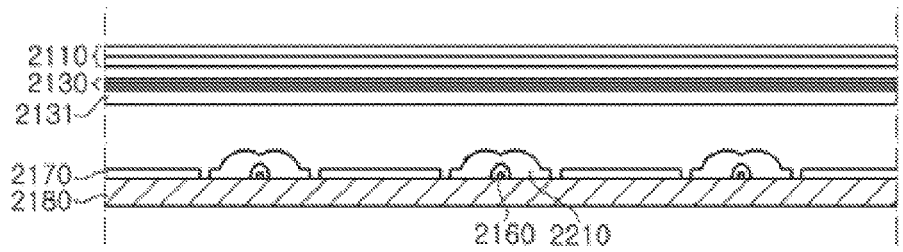
FIG. 10 is a sectional view of one embodiment of a display to which a light emitting diode according to one exemplary embodiment of the present disclosure is applied.

FIG. 10 is a sectional view of one embodiment of a display to which a light emitting diode according to one exemplary embodiment of the present disclosure is applied.

The display according to this embodiment includes a display panel 2110, a backlight unit BLU1 supplying light to the display panel 2110, and a panel guide 2100 supporting a lower edge of the display panel 2110.

The display panel 2110 is not particularly limited and may be, for example, a liquid crystal panel including a liquid crystal layer. Gate driving PCBs may be further disposed at the edge of the display panel 2110 to supply driving signals to a gate line. In this embodiment, the gate driving PCBs 2112, 2113 may be formed on a thin film transistor substrate instead of being formed on separate PCBs.

The backlight unit BLU1 includes a light source module, which includes at least one substrate 2150 and a plurality of light emitting diodes 2160. The backlight unit BLU1 may further include a bottom cover 2180, a reflective sheet 2170, a diffusive plate 2131, and optical sheets 2130.

The bottom cover 2180 may be open at an upper side thereof to receive the substrate 2150, the light emitting diodes 2160, the reflective sheet 2170, the diffusive plate 2131, and the optical sheets 2130. In addition, the bottom cover 2180 may be coupled to the panel guide 2100. The substrate 2150 may be disposed under the reflective sheet 2170 to be surrounded by the reflective sheet 2170. Alternatively, when a reflective material is coated onto a surface thereof, the substrate 2150 may be disposed on the reflective sheet 2170. Further, a plurality of substrates 2150 may be arranged parallel to one other. However, it should be understood that other implementations are also possible and the light source module may include a single substrate.

The light emitting diodes 2160 may include at least one of the light emitting diodes according to the embodiments described above. The light emitting diodes 2160 may be regularly arranged in a predetermined pattern on the substrate 2150. In addition, a lens 2210 may be disposed on each of the light emitting diodes 2160 to improve uniformity of light emitted from the plurality of light emitting diodes 2160.

The diffusive plate 2131 and the optical sheets 2130 are disposed on the light emitting devices 2160. Light emitted from the light emitting devices 2160 may be supplied in the form of sheet light to the display panel 2110 through the diffusive plate 2131 and the optical sheets 2130.

In this way, the light emitting diodes according to the embodiments may be applied to direct type displays like the display according to this embodiment.

Figure 11:
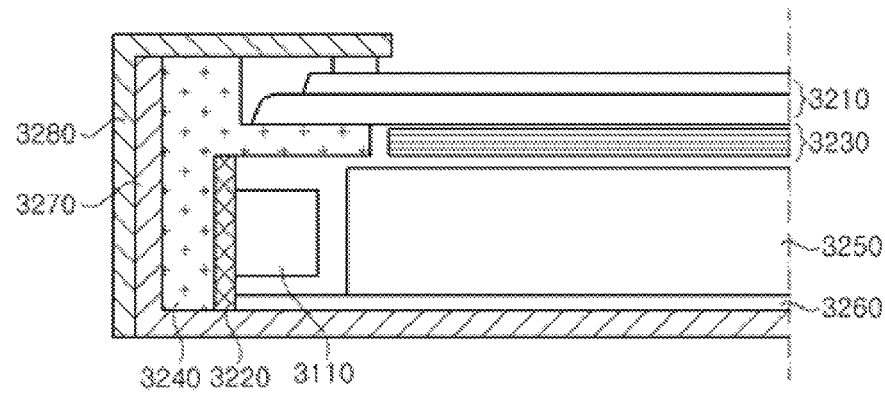
FIG. 11 is a sectional view of one embodiment of a display to which a light emitting diode according to one exemplary embodiment of the present disclosure is applied.

FIG. 11 is a sectional view of one embodiment of a display to which a light emitting diode according to one exemplary embodiment of the present disclosure is applied.

The display according to this embodiment includes a display panel 3210 on which an image is displayed, and a backlight unit BLU2 disposed at a rear side of the display panel 3210 and emitting light thereto. Further, the display includes a frame 240 supporting the display panel 3210 and receiving the backlight unit BLU2, and covers 3240, 3280 surrounding the display panel 3210.

The display panel 3210 is not particularly limited and may be, for example, a liquid crystal panel including a liquid crystal layer. A gate driving PCB may be further disposed at an edge of the display panel 3210 to supply driving signals to a gate line. Here, the gate driving PCB may be formed on a thin film transistor substrate instead of being formed on a separate PCB. The display panel 3210 is secured by the covers 3240, 3280 disposed at upper and lower sides thereof, and the cover 3280 disposed at the lower side of the display panel 3210 may be coupled to the backlight unit BLU2.

The backlight unit BLU2 supplying light to the display panel 3210 includes a lower cover 3270 partially open at an upper side thereof, a light source module disposed at one side inside the lower cover 3270, and a light guide plate 3250 disposed parallel to the light source module and converting spot light into sheet light. The backlight unit BLU2 according to this embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting diodes 3110 arranged at constant intervals on one surface of the substrate 3220. As the substrate 3220, any substrate capable of supporting the light emitting diodes 3110 and being electrically connected thereto may be used without limitation. For example, the substrate 3220 may include a printed circuit board. The light emitting diodes 3110 may include at least one of the light emitting diodes according to the exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting diodes 3110 into sheet light.

In this way, the light emitting diodes according to the embodiments may be applied to edge type displays like the display according to this embodiment.

Figure 12:
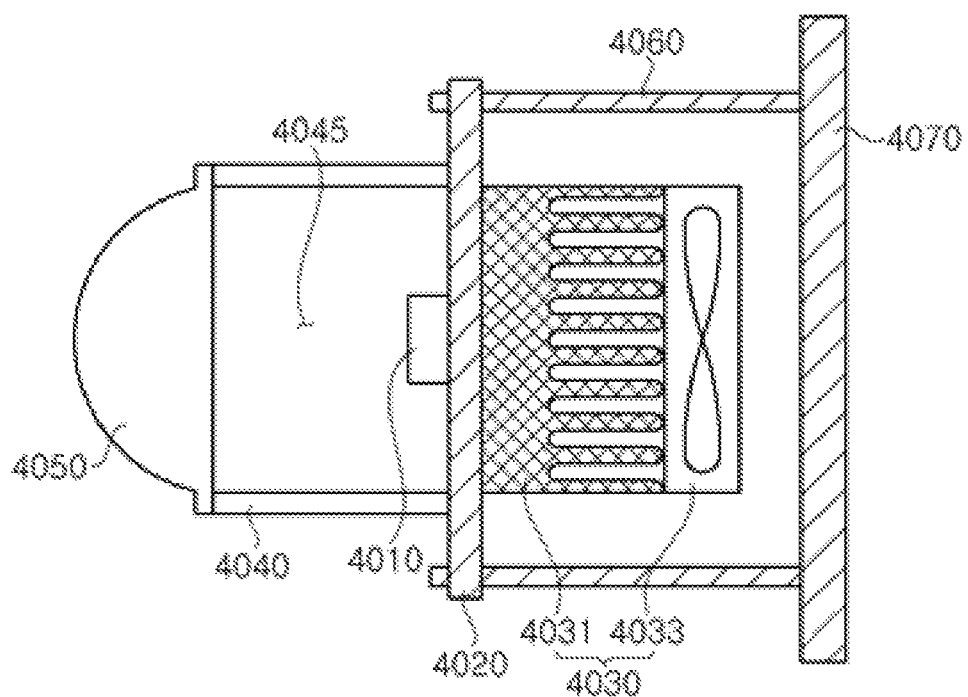
FIG. 12 is a sectional view of one embodiment of a headlight to which a light emitting diode according to one exemplary embodiment of the present disclosure is applied.

FIG. 12 is a sectional view of one embodiment of a headlight to which a light emitting diode according to one exemplary embodiment of the present disclosure is applied.

Referring to FIG. 12, the headlight according to this embodiment includes a lamp body 4070, a substrate 4020, a light emitting diode 4010, and a cover lens 4050. The headlight may further include a heat dissipation unit 4030, a support rack 4060, and a connection member 4040.

The substrate 4020 is secured by the support rack 4060 and disposed above the lamp body 4070. As the substrate 4020, any member capable of supporting the light emitting diode 4010 may be used without limitation. For example, the substrate 4020 may include a substrate having a conductive pattern, such as a printed circuit board. The light emitting diode 4010 is disposed on the substrate 4020 and may be supported and secured by the substrate 4020. In addition, the light emitting diode 4010 may be electrically connected to an external power source through the conductive pattern of the substrate 4020. Further, the light emitting diode 4010 may include at least one of the light emitting diodes according to the exemplary embodiments described above.

The cover lens 4050 is disposed on a path of light emitted from the light emitting diode 4010. For example, as shown in FIG. 12, the cover lens 4050 may be spaced apart from the light emitting diode 4010 via the connection member 4040 and may be disposed in a direction of supplying light emitted from the light emitting diode 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting diode 4010, and thus may act as a light guide that provides a luminous path 4045. The connection member 4040 may be formed of a light reflective material or coated therewith. On the other hand, the heat dissipation unit 4030 may include heat dissipation fins 4031 and/or a heat dissipation fan 4033, and dissipates heat generated upon operation of the light emitting diode 4010.

In this way, the light emitting diodes according to the exemplary embodiment may be applied to headlights, particularly, headlights for vehicles, like the headlight according to this embodiment.

Although certain exemplary embodiments have been described herein, it should be understood by those skilled in the art that these embodiments are given by way of illustration only, and that various modifications, variations, and alterations can be made without departing from the spirit and scope of the invention. Therefore, the scope of the invention should be limited only by the accompanying claims and equivalents thereof.

What is claimed is:

1. A light emitting diode comprising:
   a light emitting structure comprising a first conductive type semiconductor layer, a second conductive type semiconductor layer, and an active layer interposed between the first conductive type semiconductor layer and the second conductive type semiconductor layer;
   a first contact electrode forming ohmic contact with the first conductive type semiconductor layer;
   a second contact electrode disposed on the second conductive type semiconductor layer; and
   an insulation layer disposed on the light emitting structure and insulating the first contact electrode from the second contact electrode,
   wherein the first conductive type semiconductor layer comprises a nitride-based substrate,
   the nitride-based substrate having a thread dislocation density of $10^4$ cm$^{-2}$ or less, an oxygen impurity concentration of $10^{19}$ cm$^{-3}$ or less, and an optical extinction coefficient of less than 5 cm$^{-1}$ at a wavelength of 465 nm to 700 nm.

2. The light emitting diode according to claim 1, wherein the nitride-based substrate has a thread dislocation density of $10^3$ cm$^{-2}$ or less and an oxygen impurity concentration of $3 \times 10^{17}$ cm$^{-3}$ or less.

3. The light emitting diode according to claim 1, wherein the nitride-based substrate has a non-polar or semi-polar growth plane.

4. The light emitting diode according to claim 1, wherein the nitride-based substrate is doped or undoped to have the same conductive type as the first conductive type semiconductor layer.

5. The light emitting diode according to claim 4, wherein the nitride-based substrate has a thickness of 270 μm to 330 μm.

6. The light emitting diode according to claim 1, wherein the second contact electrode comprises a conductive oxide layer forming ohmic contact with the second conductive type semiconductor layer and a reflective electrode layer disposed on the conductive oxide layer.

7. The light emitting diode according to claim 6, wherein the conductive oxide layer comprises ITO and the reflective electrode layer comprises Ag.

8. The light emitting diode according to claim 6, wherein the conductive oxide layer has a larger area than the reflective electrode layer, the reflective electrode layer being placed within a peripheral region of the conductive oxide layer.

9. The light emitting diode according to claim 8, wherein the conductive oxide layer covers 90% or more of an upper surface of the second conductive type semiconductor layer.

10. The light emitting diode according to claim 1, wherein the light emitting structure comprises a plurality of mesas each including the second conductive type semiconductor layer and the active layer, the second contact electrode is disposed on the plurality of mesas, and the first conductive type semiconductor layer is exposed through at least some region around the plurality of mesas.

11. The light emitting diode according to claim 10, wherein the insulation layer comprises a first insulation layer and a second insulation layer,
   the first insulation layer covering the plurality of mesas and the first conductive type semiconductor layer, and comprising a first opening and a second opening partially exposing the first conductive type semiconductor layer and the second contact electrode, respectively.

12. The light emitting diode according to claim 11, wherein the first contact electrode forms ohmic contact with the first conductive type semiconductor layer through the first opening,
the first contact electrode being disposed on a portion of upper surfaces of the plurality of mesas and on side surfaces of the plurality of mesas while being insulated from the plurality of mesas.

13. The light emitting diode according to claim 12, wherein the second insulation layer partially covers the first contact electrode and comprises a third opening and a fourth opening partially exposing the first contact electrode and the second contact electrode, respectively.

14. The light emitting diode according to claim 13, further comprising:
a first pad electrode disposed on the second insulation layer and electrically connected to the first contact electrode through the third opening; and
a second pad electrode disposed on the second insulation layer and electrically connected to the second contact electrode through the fourth opening.

15. The light emitting diode according to claim 10, wherein the insulation layer covers the plurality of mesas and the first conductive type semiconductor layer, and comprises a first opening and a second opening partially exposing the first conductive type semiconductor layer and the second contact electrode, respectively.

16. The light emitting diode according to claim 15, wherein the first contact electrode forms ohmic contact with the first conductive type semiconductor layer through the first opening, and is disposed on a portion of upper surfaces of the plurality of mesas and on side surfaces of the plurality of mesas while being insulated from the plurality of mesas.

17. The light emitting diode according to claim 16, further comprising:
a pad electrode disposed on the insulation layer and electrically connected to the second contact electrode through the second opening,
the pad electrode being spaced apart from the first contact electrode.

18. The light emitting diode according to claim 17, wherein the light emitting structure comprises a first region including one side surface thereof and a second region including the other side surface opposite the one side surface, the first contact electrode being disposed within the first region, the pad electrode being disposed within the second region.

19. The light emitting diode according to claim 10, wherein the first contact electrode is placed on at least part of the exposed region of the first conductive type semiconductor layer.

20. The light emitting diode according to claim 19, wherein the insulation layer covers the plurality of mesas and the first conductive type semiconductor layer, and comprises a first opening and a second opening partially exposing the first contact electrode and the second contact electrode, respectively.

21. The light emitting diode according to claim 20, further comprising:
a first pad electrode disposed on the insulation layer and electrically connected to the first contact electrode through the first opening; and
a second pad electrode disposed on the insulation layer and electrically connected to the second contact electrode through the second opening;
wherein the first pad electrode is placed on a portion of upper surfaces of the plurality of mesas and on a portion of side surfaces of the plurality of mesas while being separated from the plurality of mesas via the insulation layer.

22. The light emitting diode according to claim 6, wherein the light emitting structure comprises a region through which the first conductive type semiconductor layer is partially exposed, and the insulation layer comprises a first insulation layer,
the first insulation layer partially covering the light emitting structure and the second contact electrode and comprising a first opening and a second opening partially exposing the first conductive type semiconductor layer and the second contact electrode, respectively.

23. The light emitting diode according to claim 22, wherein the first insulation layer comprises a pre-insulation layer and a main insulation layer disposed on the pre-insulation layer,
the pre-insulation layer covering a portion of the light emitting structure and a portion of a conductive oxide.

24. The light emitting diode according to claim 23, wherein the pre-insulation layer comprises an opening partially exposing the conductive oxide and the reflective electrode layer is disposed inside the opening.

25. The light emitting diode according to claim 24, wherein the main insulation layer partially covers the reflective electrode layer.

26. The light emitting diode according to claim 23, wherein the insulation layer further comprises a second insulation layer disposed on the first insulation layer and partially covering the first contact electrode, and the first insulation layer has a greater thickness than the second insulation layer.

* * * * *